US011296025B2

United States Patent
Chan et al.

(10) Patent No.: US 11,296,025 B2
(45) Date of Patent: Apr. 5, 2022

(54) INTERCONNECTION STRUCTURE AND SENSOR PACKAGE

(71) Applicant: Advanced Semiconductor Engineering, Inc., Kaohsiung (TW)

(72) Inventors: Hsun-Wei Chan, Kaohsiung (TW); Shih-Chieh Tang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/514,962

(22) Filed: Jul. 17, 2019

(65) Prior Publication Data

US 2020/0027834 A1 Jan. 23, 2020

Related U.S. Application Data

(60) Provisional application No. 62/700,090, filed on Jul. 18, 2018.

(51) Int. Cl.
*H01L 23/528* (2006.01)
*H05K 1/18* (2006.01)

(52) U.S. Cl.
CPC ......... *H01L 23/5283* (2013.01); *H05K 1/183* (2013.01); *H05K 2201/10151* (2013.01)

(58) Field of Classification Search
CPC ....... H01L 23/528–5283; H01L 31/00–02002; H01L 31/0203; H01L 31/0224; H01L 23/5283
See application file for complete search history.

(56) References Cited

U.S. PATENT DOCUMENTS

2006/0273435 A1* 12/2006 Lin ................... H01L 27/14618
257/678
2017/0278768 A1* 9/2017 Higgins, III ........ H01L 21/4828

FOREIGN PATENT DOCUMENTS

JP 4884457 B2 2/2012

\* cited by examiner

*Primary Examiner* — Suberr L Chi
(74) *Attorney, Agent, or Firm* — Foley & Lardner LLP

(57) ABSTRACT

A sensor package includes a carrier, a sensor, an interconnection structure, a conductor and a housing. The sensor is disposed on the carrier. The interconnection structure is disposed on the carrier and surrounds the sensor. The interconnection structure has a first surface facing away from the carrier. The conductor is disposed on the first carrier. The conductor having a first portion covered by the interconnection structure and a second portion exposed from the first surface of the interconnection structure. The housing is disposed on the carrier and surrounds the interconnection structure.

24 Claims, 17 Drawing Sheets

INTERCONNECTION STRUCTURE AND SENSOR PACKAGE

CROSS-REFERENCE TO RELATED APPLICATIONS

This application claims the benefit of and priority to U.S. Provisional Application No. 62/700,090, filed Jul. 18, 2018, the contents of which are incorporated herein by reference in their entirety.

BACKGROUND

1. Technical Field

The present disclosure relates to an interconnection structure and a sensor package.

2. Description of the Related Art

Sensor packages are used in various applications. A sensor package may include a carrier, a sensor and a housing. The housing is placed on the carrier and has a cavity to accommodate the sensor. To protect the sensor, an insulation material could be filled within the cavity to cover the sensor. However, it is difficult to implement input/output (I/O) structure within the cavity. Therefore, the connection ability (or flexibility) of the sensor package may be adversely affected.

SUMMARY

In accordance with some embodiments of the present disclosure, a sensor package includes a carrier, a sensor, an interconnection structure, a conductor and a housing. The sensor is disposed on the carrier. The interconnection structure is disposed on the carrier and surrounds the sensor. The interconnection structure has a first surface facing away from the carrier. The conductor is disposed on the first carrier. The conductor having a first portion covered by the interconnection structure and a second portion exposed from the first surface of the interconnection structure. The housing is disposed on the carrier and surrounds the interconnection structure.

In accordance with some embodiments of the present disclosure, a sensor package includes a carrier, a sensor, an interconnection structure, a conductor and a housing. The interconnection structure is disposed on the carrier and surrounds the sensor. The interconnection structure has a first surface facing away from the carrier. The conductor is disposed on the first carrier. The conductor having a first portion covered by the interconnection structure and a second portion exposed from the first surface of the interconnection structure. The sensor is disposed on the interconnection structure. The housing is disposed on the carrier and surrounds the interconnection structure.

Figure 1A:
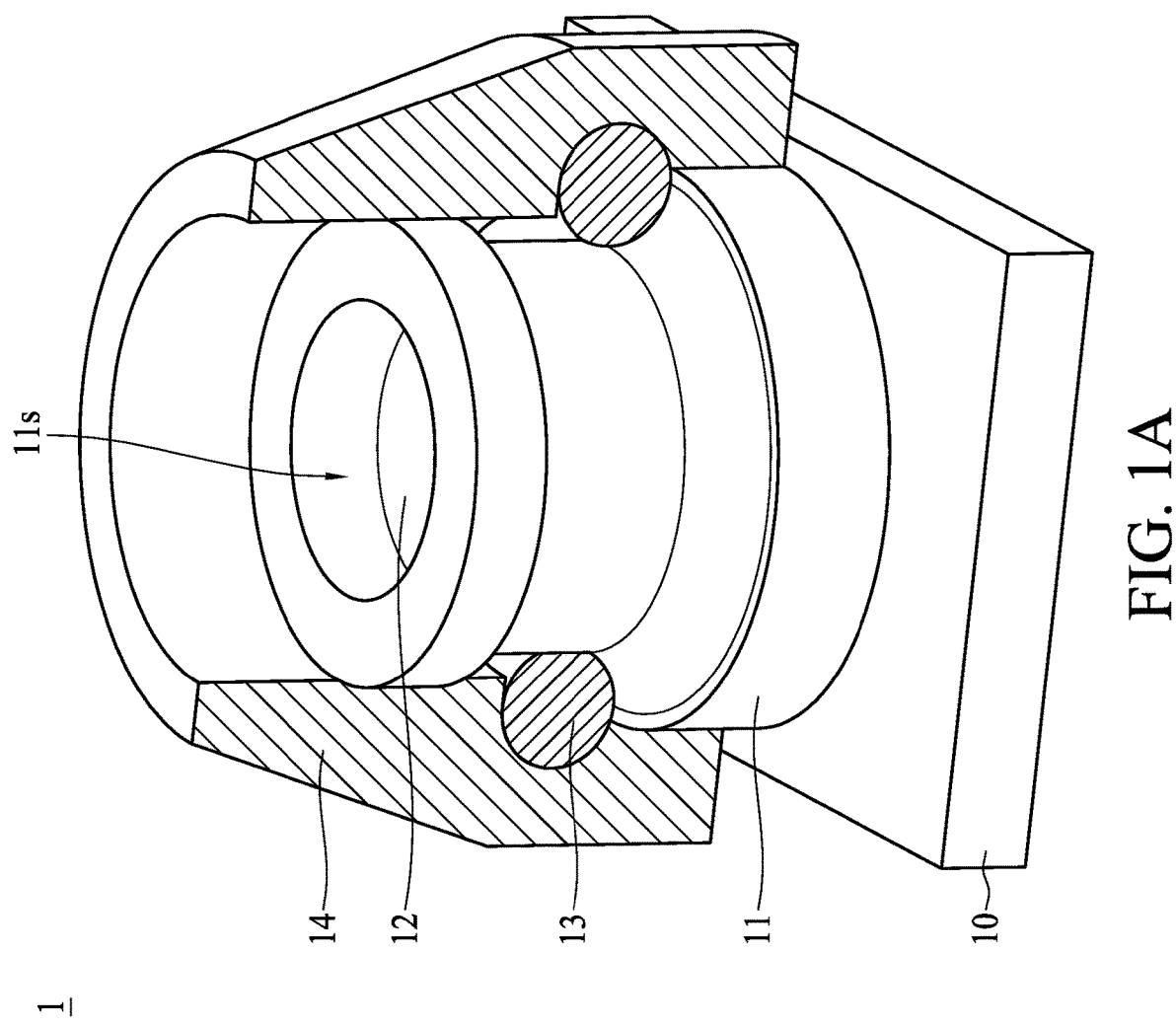
FIG. 1A shows a perspective view of a sensor package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

A sensor package may include a sensor such as a sensor die or a sensor device. A sensor package may include a housing, a metal ring, a cap, a sealing structure, or a body. A sensor package may include an insulation material. The sensor may be disposed in a space or a chamber defined within the housing. The sensor may be a pressure sensor. The space may be filled with the insulation material. The sensor may be sealed by or embedded in the insulation material. The insulation material may be used for transducing or transferring pressure.

A sensor package may be part of an electronic device. A sensor package may include a surface mount device (SMD). A sensor package may be part of an SMD. A sensor package may cooperate with an electronic device. A sensor package may specify electrical connection with an electronic device. A sensor package may specify a connection structure or a conductor on the side of a sensor. A sensor package may specify a connection structure within a space defined by a housing of the sensor package. A sensor package may specify a connection structure within a metal ring or a sensing chamber of the sensor package for electrical connection with an external device.

FIG. 1A shows a sensor package 1 in accordance with some embodiments of the present disclosure. The sensor package 1 includes a substrate 10, a metal cap 11, an insulation material 12, an O-ring 13 and a connector 14. A space 11s is defined by the metal cap 11. The insulation material 12 is filled in the space 11s. Although it is not shown in the figure, it is contemplated that a sensor is disposed within the space 11s and covered or partially covered by the insulation material 12. The sensor may be a pressure sensor, for example, a liquid/fluid pressure sensor.

The substrate 10 may include plastic or rubber material. The metal cap 11 may include stainless steel. The O-ring 13 may be used to fix or support the sensor package 1.

Figure 1B:
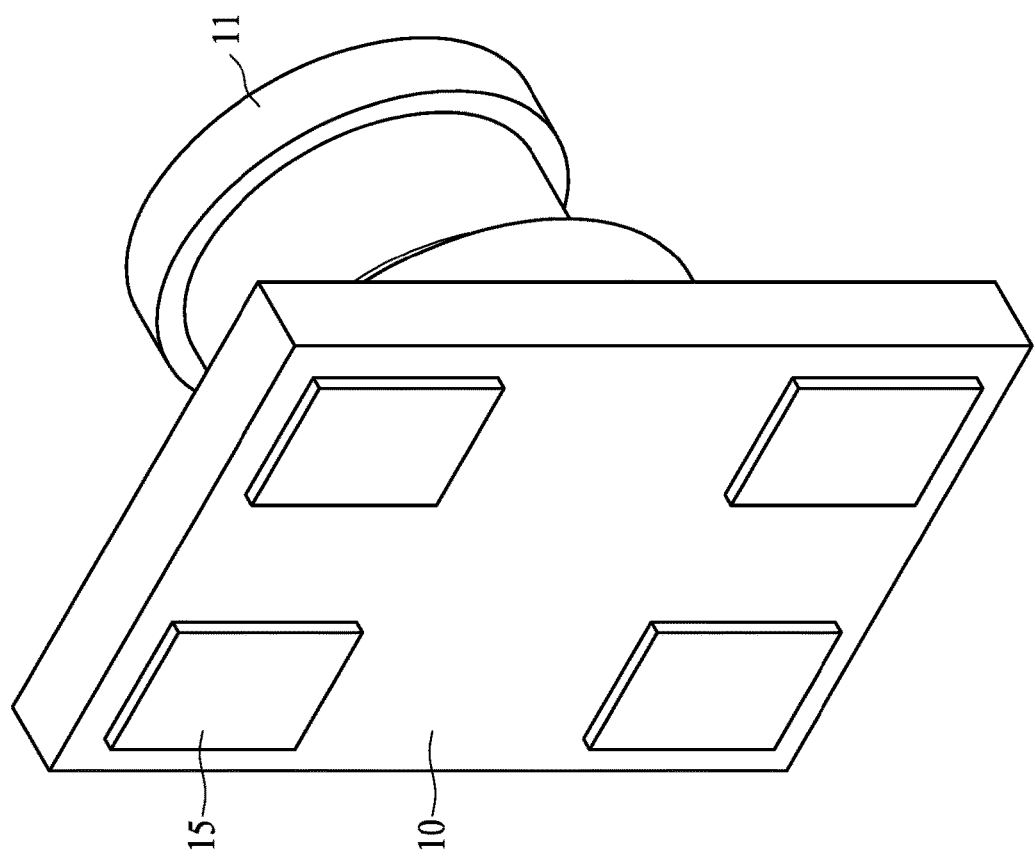
FIG. 1B shows a perspective view of a sensor package in accordance with some embodiments of the present disclosure.

FIG. 1B shows a different perspective view (or a bottom view) of the sensor package 1 in FIG. 1A.

Referring to FIG. 1B, several electrodes 15 are disposed on a bottom surface of the substrate 10. In other embodiments, the electrodes 15 are disposed within the substrate 10 and exposed from the substrate 10.

Referring to FIGS. 1A and 1B, the sensor within the space 11s may be electrically connected to the electrodes 15. The electrodes 15 may be electrically connected with the connector 14. The sensor within the space 11s may be electrically connected with another electronic device by the electrode 15. The sensor within the space 11s may be electrically connected with another electronic device by the connector 14.

According to the embodiments in FIGS. 1A and 1B, it is difficult to implement input/output (I/O) structure within the space 11s of the sensor package 1. Therefore, the connection ability (or flexibility) of the sensor package 1 may be adversely affected.

In other embodiments, the metal cap 11 may be replaced by a plastic structure. A pattern or a circuit may be disposed in the plastic structure for electrical connection. However, a plastic structure may not have enough robustness (or strength) against pressure (or stress). A plastic structure may be easily deformed. In addition, the plastic structure may have a relatively large size or volume, which would hinder the miniaturization for the sensor package.

Figure 2A:
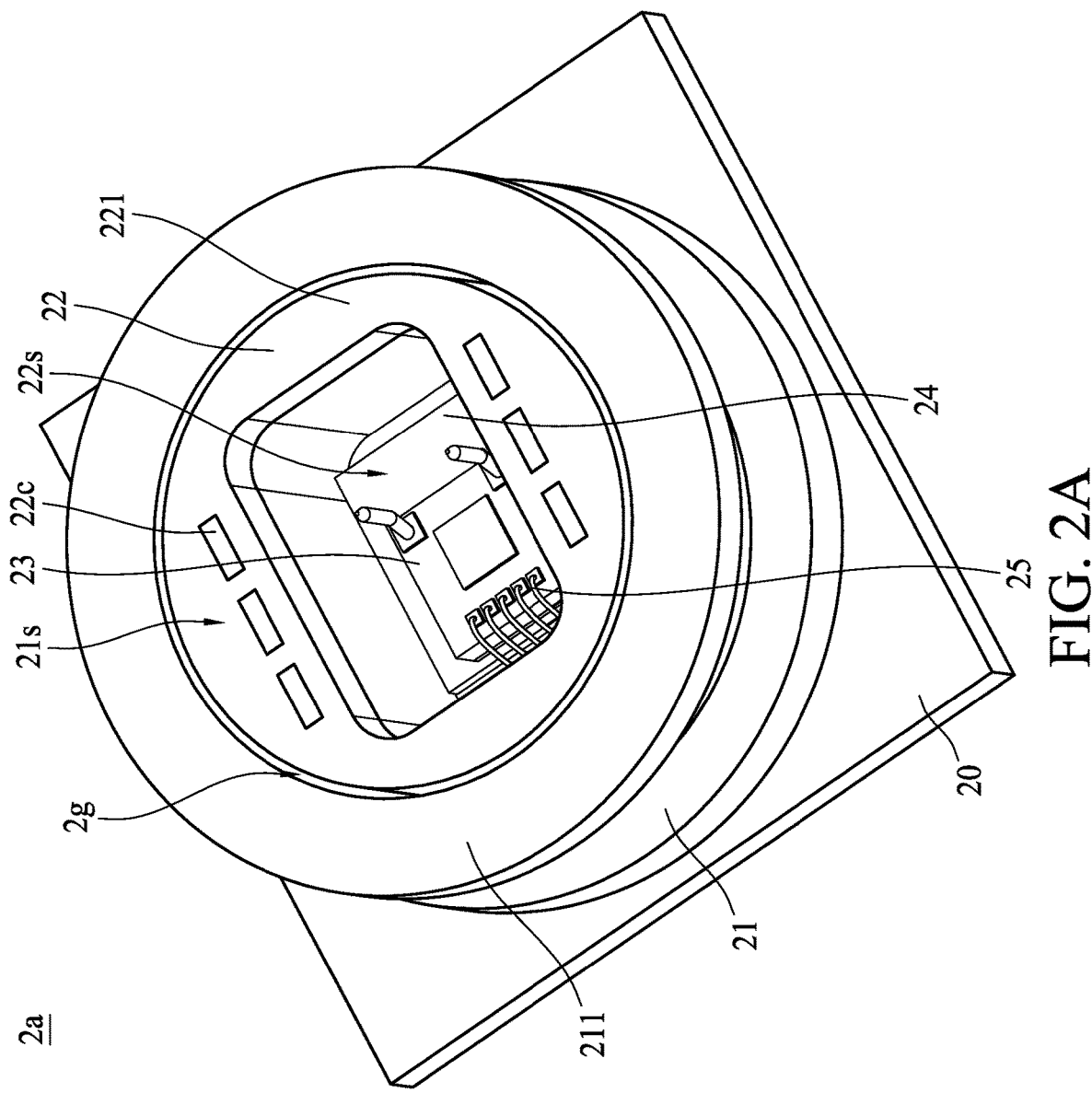
FIG. 2A shows a perspective view of a sensor package in accordance with some embodiments of the present disclosure.

FIG. 2A shows a perspective view of a sensor package 2a in accordance with some embodiments of the present disclosure. The sensor package 2a includes a carrier 20, a housing 21, an interconnection structure 22, a sensor 23 and an electronic component 24.

The carrier 20 may include, for example, a printed circuit board, such as a paper-based copper foil laminate, a composite copper foil laminate, or a polymer-impregnated glass-fiber-based copper foil laminate. The carrier 20 may include an interconnection structure, such as a plurality of conductive traces or a through via. In some embodiments, the carrier 20 includes a ceramic material or a metal plate. In some embodiments, the carrier 20 includes a substrate, such as an organic substrate or a leadframe. In some embodiments, the carrier 20 includes a two-layer (or more than two layers, for example, four or six layers) substrate which includes a core layer and a conductive material and/or structure disposed on an upper surface and a bottom surface of the carrier 20. The conductive material and/or structure may include a plurality of traces.

The housing 21 is disposed on the carrier 20. The housing 21 may have a ring shape. The housing 21 may have a cylindrical shape. A space 21s is defined by the housing 21. The space 21s is defined within the housing 21. The housing 21 may include conductive material. The housing 21 may include, for example, aluminum (Al), copper (Cu), chromium (Cr), tin (Sn), gold (Au), silver (Ag), nickel (Ni) or stainless steel, or a mixture, an alloy, or other combination thereof. The housing 21 may have water-proof function. The housing 21 may have relatively good robustness against pressure or stress.

The interconnection structure 22 is disposed on the carrier 20. The interconnection structure 22 is disposed within the space 21s. The interconnection structure 22 is surrounded by the housing 21. The interconnection structure 22 is separated from the housing 21. For example, the interconnection structure 22 is not in contact with the housing 21. For example, a gap 2g exists between the interconnection structure 22 and the housing 21. In some embodiments, an adhesive material may be disposed within the gap 2g. The adhesive material may be used to bond or connect the interconnection structure 22, the housing 21 and/or the carrier 20 together. In some embodiments, a portion of the interconnection structure 22 may be in contact with the housing 21. A surface 221 of the interconnection structure 22 may be substantially coplanar with a surface 211 of the housing 21. A space 22s is defined by the interconnection structure 22. For example, the space 22s is defined by an inner sidewall of the interconnection structure 22. The space 22s is defined within the interconnection structure 22. The interconnection structure 22 may be or include an interposer.

The interconnection structure 22 may include an insulation material. The interconnection structure 22 may include a plastic material, for example, thermoplastic or thermosetting plastic material. The interconnection structure 22 may include polymer. The interconnection structure 22 includes conductors 22c. The interconnection structure 22 may include an insulation material or a plastic material surrounding the conductor 22c. The conductor 22c may extend within the interconnection structure 22. The conductor 22c may extend through the interconnection structure 22. The conductor 22c may include a bulk portion. The conductor 22c may include a conductive pin. An end or a surface of the conductor 22c is exposed from the interconnection structure 22. The exposed portion of the conductor 22c may be used for electrical connection with external electrical devices. The conductor 22c may be electrically connected to the sensor 23. The conductor 22c may be electrically connected to the electronic component 24. The conductor 22c may be electrically connected to the carrier 20. In some embodiments, the interconnection structure 22 in FIG. 2A has six conductors 22c, however, the number of conductors 22c can be changed depending on different design specifications. For example, there are N conductors 22c, in which N is an integer greater than 0. The conductor 22c may include, for example, Al, Cu, Cr, Sn, Au, Ag, Ni or stainless steel, or a mixture, an alloy, or other combination thereof.

In accordance with the embodiments in FIG. 2A, because the interconnection structure 22 has a conductor portion and a plastic portion, the interconnection structure 22 can have sufficient structural strength and can support another device disposed on or electrically connected to the interconnection structure 22. In addition, the interconnection structure 22 can increase the connection ability (or flexibility) of the sensor package 2a. In some embodiments, the housing 21 and the interconnection structure 22 can be assembled before combining with other parts of the sensor package 2a, which may reduce a size of the sensor package 2a. The manufacturing process of the sensor package 2a may be simplified.

The electronic component 24 is disposed on the carrier 20. The electronic component is disposed within the space 22s. The electronic component 24 is surrounded by the interconnection structure 22. The electronic component 24 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 24 may include an application-specific integrated circuit (ASIC) die.

The sensor 23 is disposed within the space 22s. In some embodiments, the sensor 23 can be disposed on the electronic component 24 or the carrier 20 depending on different design specifications. The sensor 23 is surrounded by the interconnection structure 22. The sensor 23 may be a pressure sensor, for example, a liquid/fluid pressure sensor. The sensor 23 is electrically connected to the carrier 20 by conductive wires 25.

Although it is not shown in FIG. 2A, it is contemplated that an insulation material is filled into the space 22s. The sensor 23 may be (fully or partially) encapsulated by, sealed by or embedded in the insulation material. The insulation material may be used for transducing or transferring pressure.

Figure 2B:
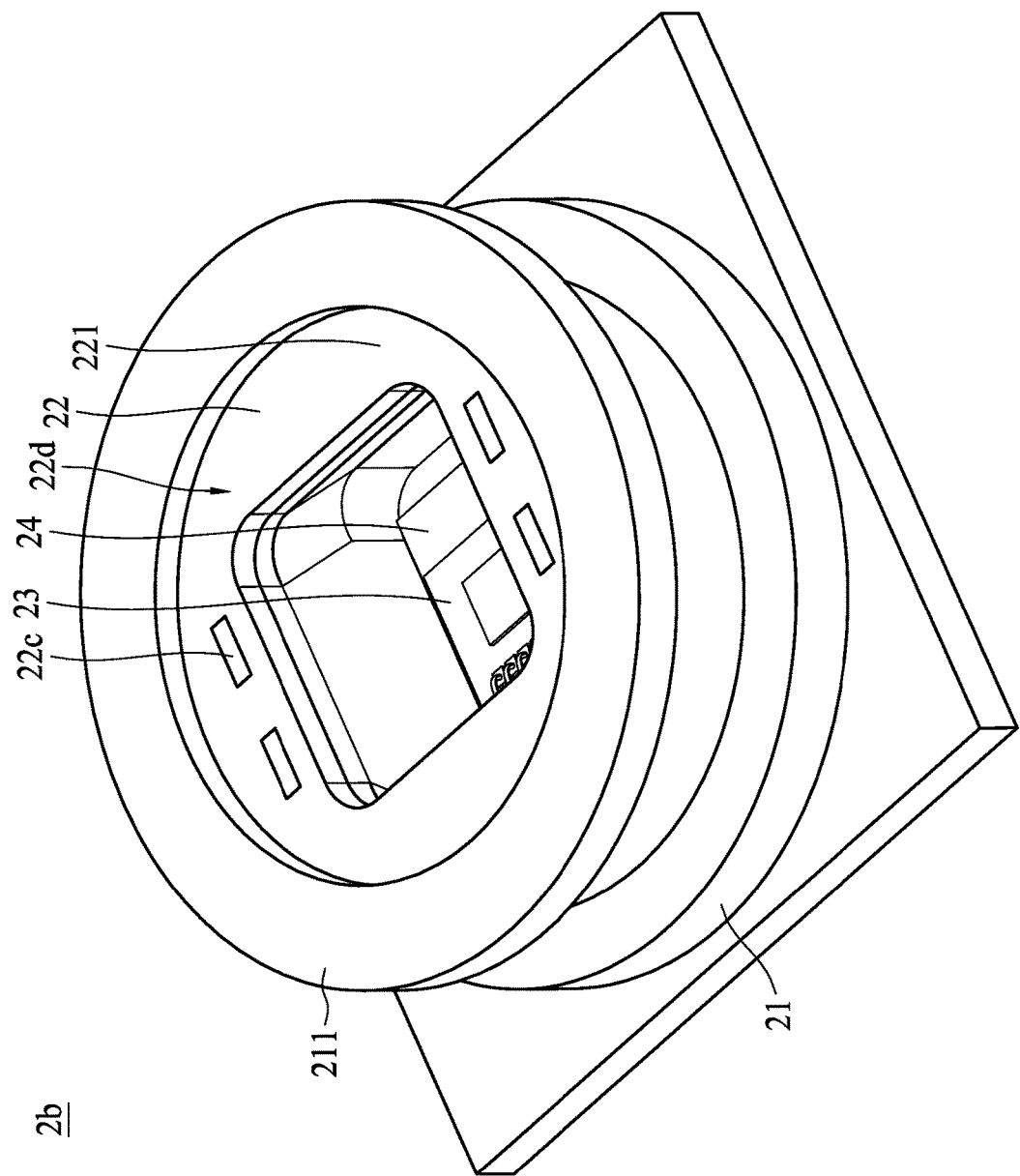
FIG. 2B shows a perspective view of a sensor package in accordance with some embodiments of the present disclosure.

FIG. 2B shows a perspective view of a sensor package 2b in accordance with some embodiments of the present disclosure. The sensor package 2b is similar to the sensor package 2a, and the differences therebetween are described below.

The interconnection structure 22 has four conductors 22c. The interconnection structure 22 is in contact with the housing 21. The interconnection structure 22 is engaged with an inner sidewall of the housing 21. A surface 221 of the interconnection structure 22 is not coplanar with a surface 211 of the housing 21. For example, the surface 221 of the interconnection structure 22 is lower than a surface 211 of the housing 21. For example, a dent or recess 22d is defined by the interconnection structure 22 and the housing 21. For example, the dent 22d is defined by the surface 221 of the interconnection structure 22 and the surface 211 of the housing 21.

Figure 3A:
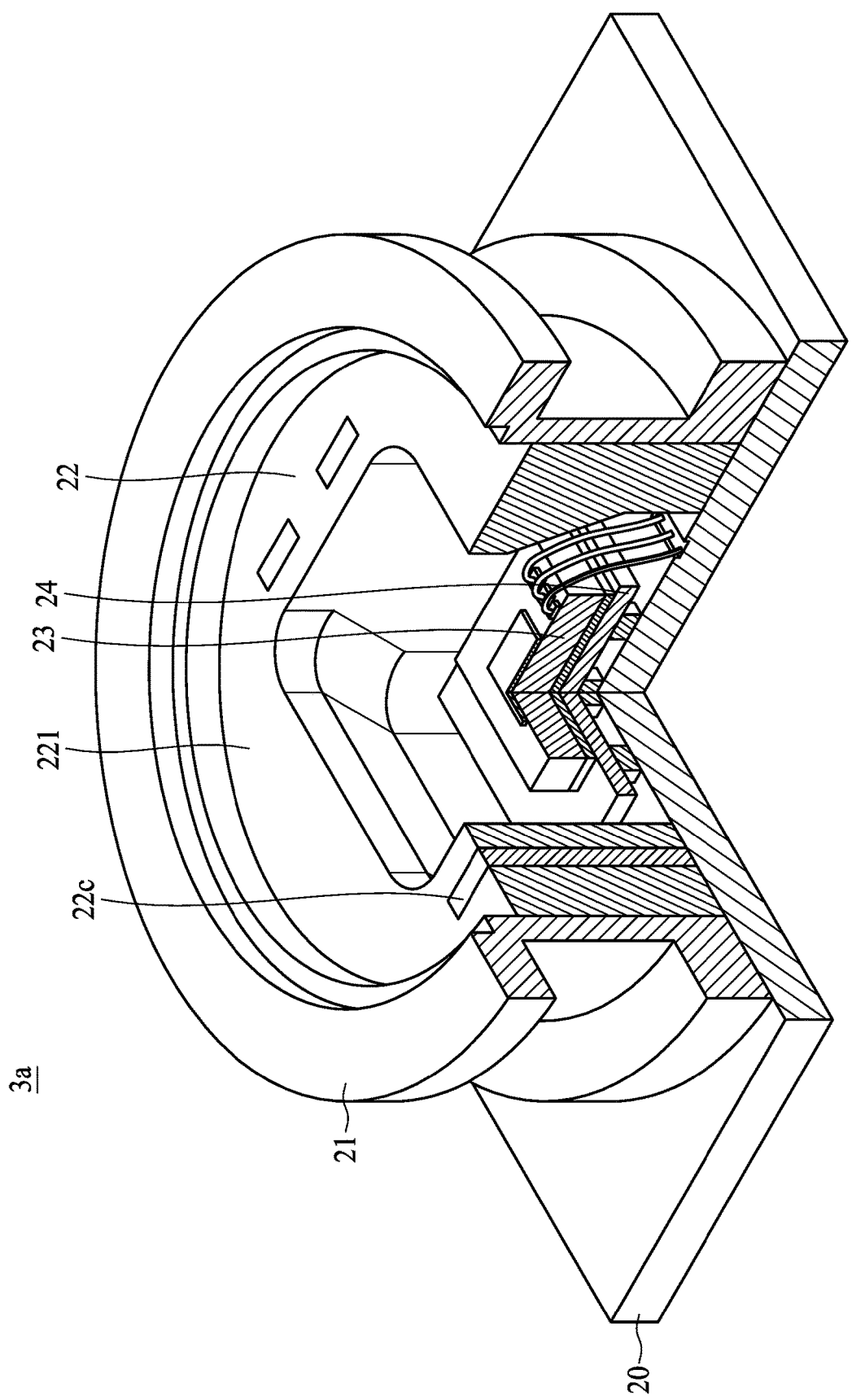
FIG. 3A shows a perspective view of a sensor package in accordance with some embodiments of the present disclosure.
Figure 3B:
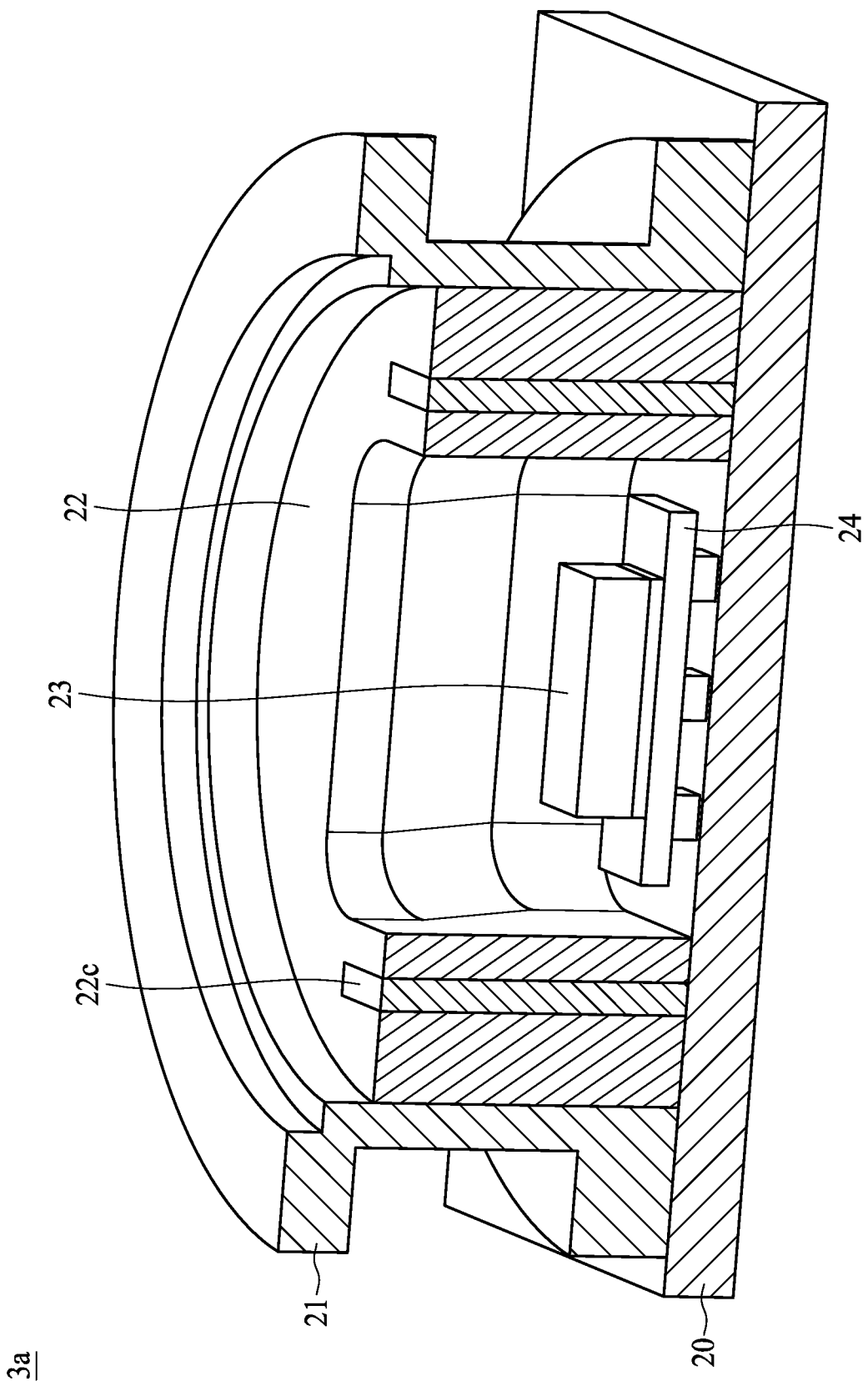
FIG. 3B shows a cross-sectional view of a sensor package in accordance with some embodiments of the present disclosure.

FIG. 3A shows a perspective view of a sensor package 3a in accordance with some embodiments of the present disclosure. FIG. 3B shows a cross-sectional view of the sensor package 3a illustrated in FIG. 3A in accordance with some embodiments of the present disclosure.

Referring to FIGS. 3A and 3B, a portion of the sensor 23 is covered by the interconnection structure 22. A portion of the sensor 23 is sealed by or embedded in the interconnection structure 22. The conductor 22c extends from a surface 221 of the interconnection structure 22 to the carrier 20.

Figure 3C:
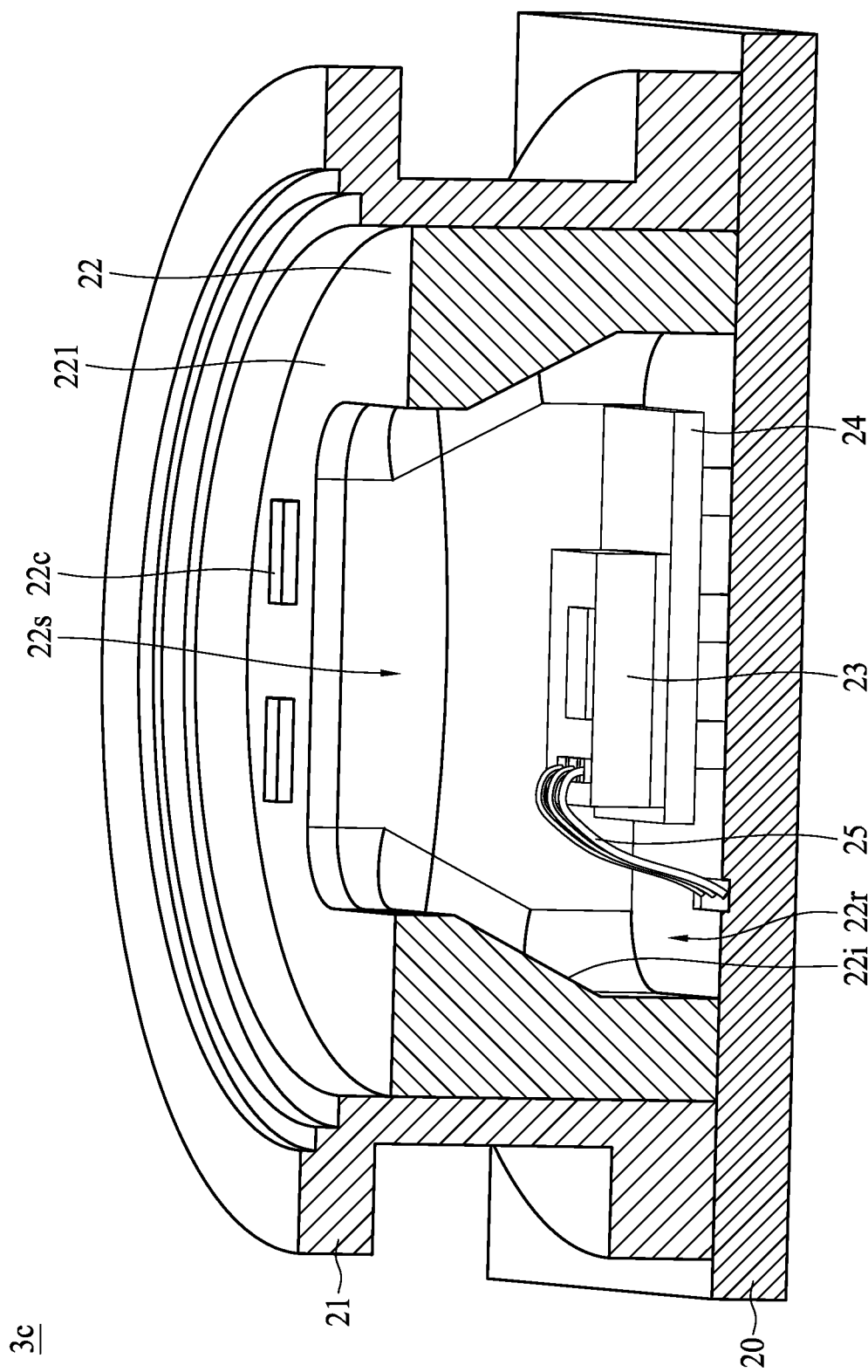
FIG. 3C shows a cross-sectional view of a sensor package in accordance with some embodiments of the present disclosure.
Figure 3D:
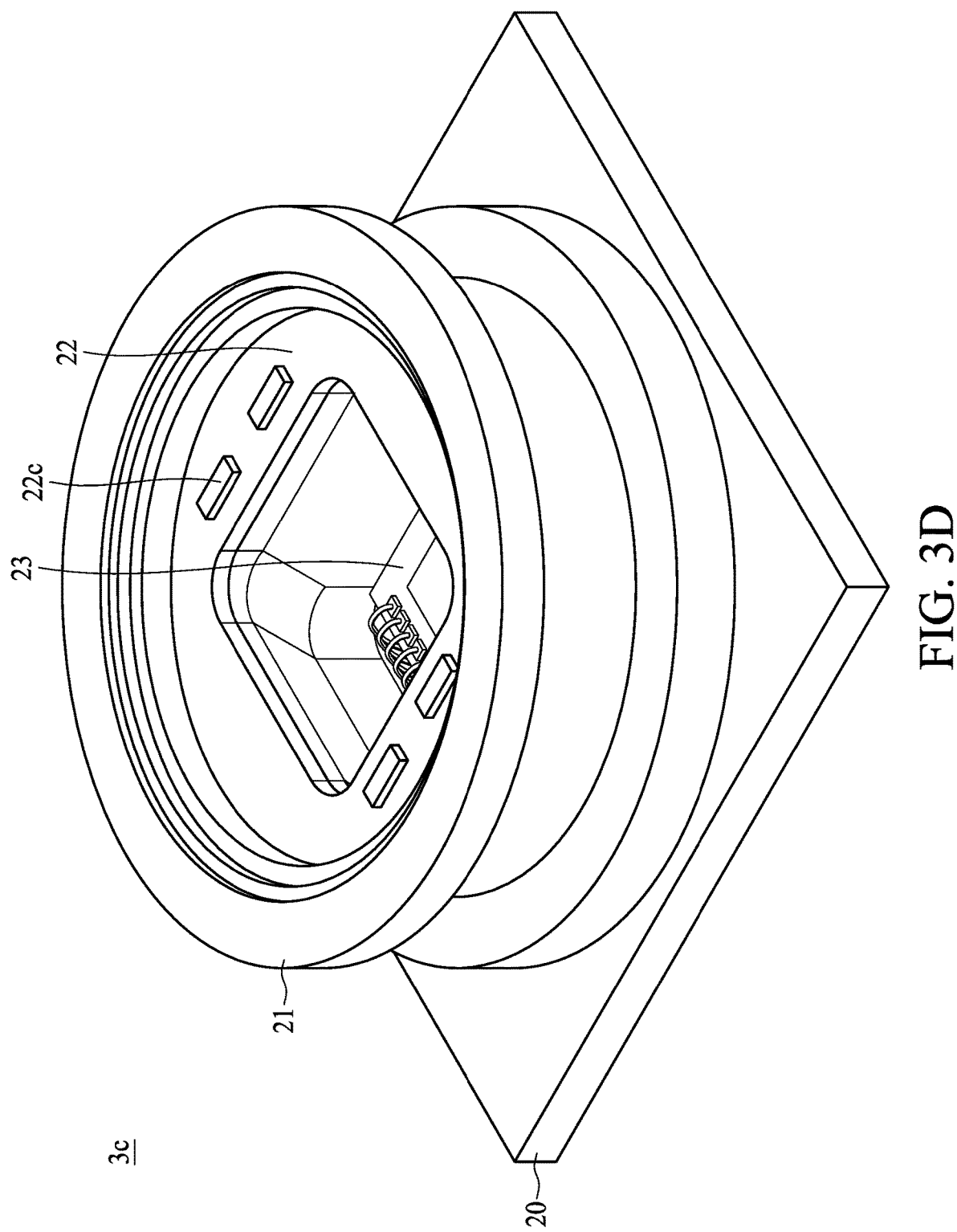
FIG. 3D shows a perspective view of a sensor package in accordance with some embodiments of the present disclosure.

FIG. 3C shows a cross-sectional view of a sensor package 3c in accordance with some embodiments of the present disclosure. FIG. 3D shows a perspective view of the sensor package 3c illustrated in FIG. 3C in accordance with some embodiments of the present disclosure. The sensor package 3c is similar to the sensor package 2a in FIG. 2A or the sensor package 2b in FIG. 2B, and the difference therebetween are described below.

A portion or an end of the conductor 22c protrudes above a surface 221 of the interconnection structure 22. A portion of a sidewall of the connector 22c is exposed. Although it is not shown in FIG. 3C, the conductor 22c may have a routing portion (or a pattern/redistribution layer) disposed within the interconnection structure 22. The routing portion may be electrically connected with the carrier 20. An inner sidewall 22i of the interconnection structure 22 is inclined or slanted with respect to the surface 22l of the interconnection structure 22. The space 22s defined by the inner sidewall 22i has a tapered portion. For example, a radius of the space 22s adjacent to the carrier 20 is greater than a radius of the space 22s far away from the carrier 20. A recess 22r is defined on the inner sidewall 22i of the interconnection structure 22. The sensor 23 is electrically connected to the carrier 20 by wires 25. A portion of the wires 25 may extend into the recess 22r. A portion of the wires may be accommodated in the recess 22r, which would further reduce the size of the sensor package 3c.

Figure 4A:
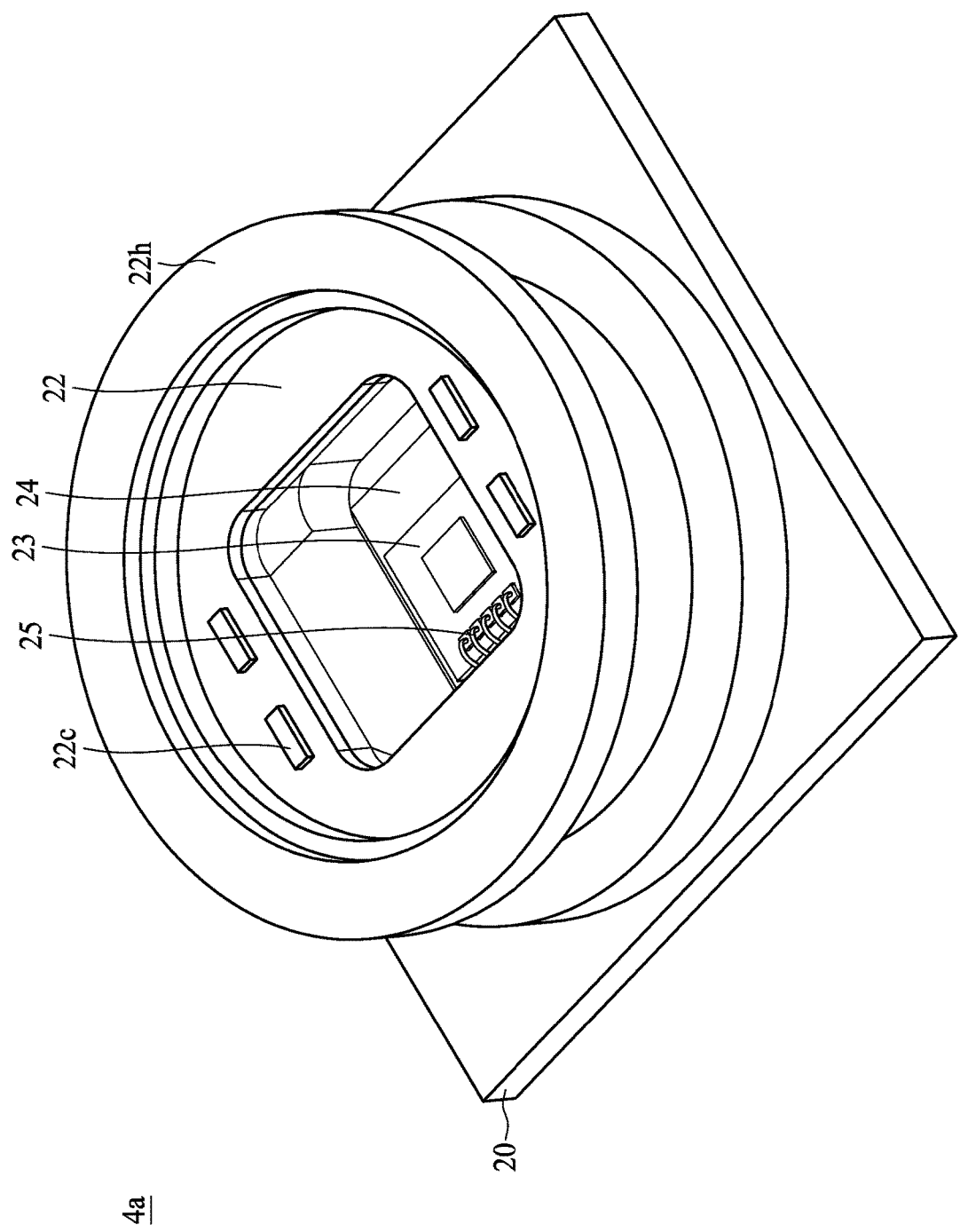
FIG. 4A shows a perspective view of a sensor package in accordance with some embodiments of the present disclosure.
Figure 4B:
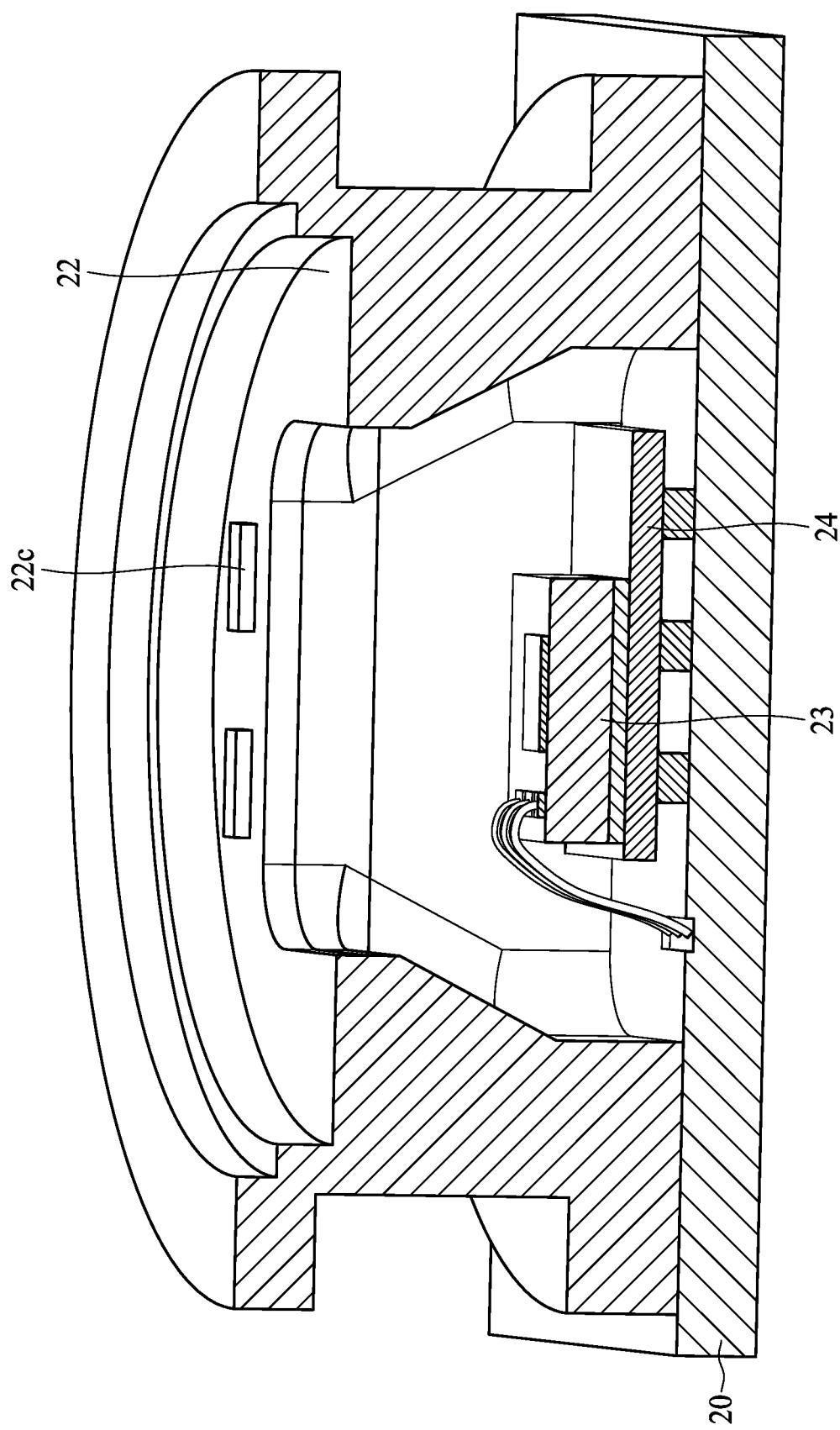
FIG. 4B shows a cross-sectional view of a sensor package in accordance with some embodiments of the present disclosure.

FIG. 4A shows a sensor package 4a in accordance with some embodiments of the present disclosure. FIG. 4B shows a perspective view of the sensor package 4a illustrated in FIG. 4A in accordance with some embodiments of the present disclosure. The sensor package 4a is similar to the sensor package 2a in FIG. 2A or the sensor package 2b in FIG. 2B, and the differences therebetween are described below.

The sensor package 4a may not have a housing which includes conductive material. The interconnection structure 22 has a portion 22h which may have similar shape as the housing 21 of the sensor package 2a in FIG. 2a. The portion 22h and other portions of the interconnection structure 22 may be integrally formed. A metal ring may be omitted or eliminated.

Figure 4C:
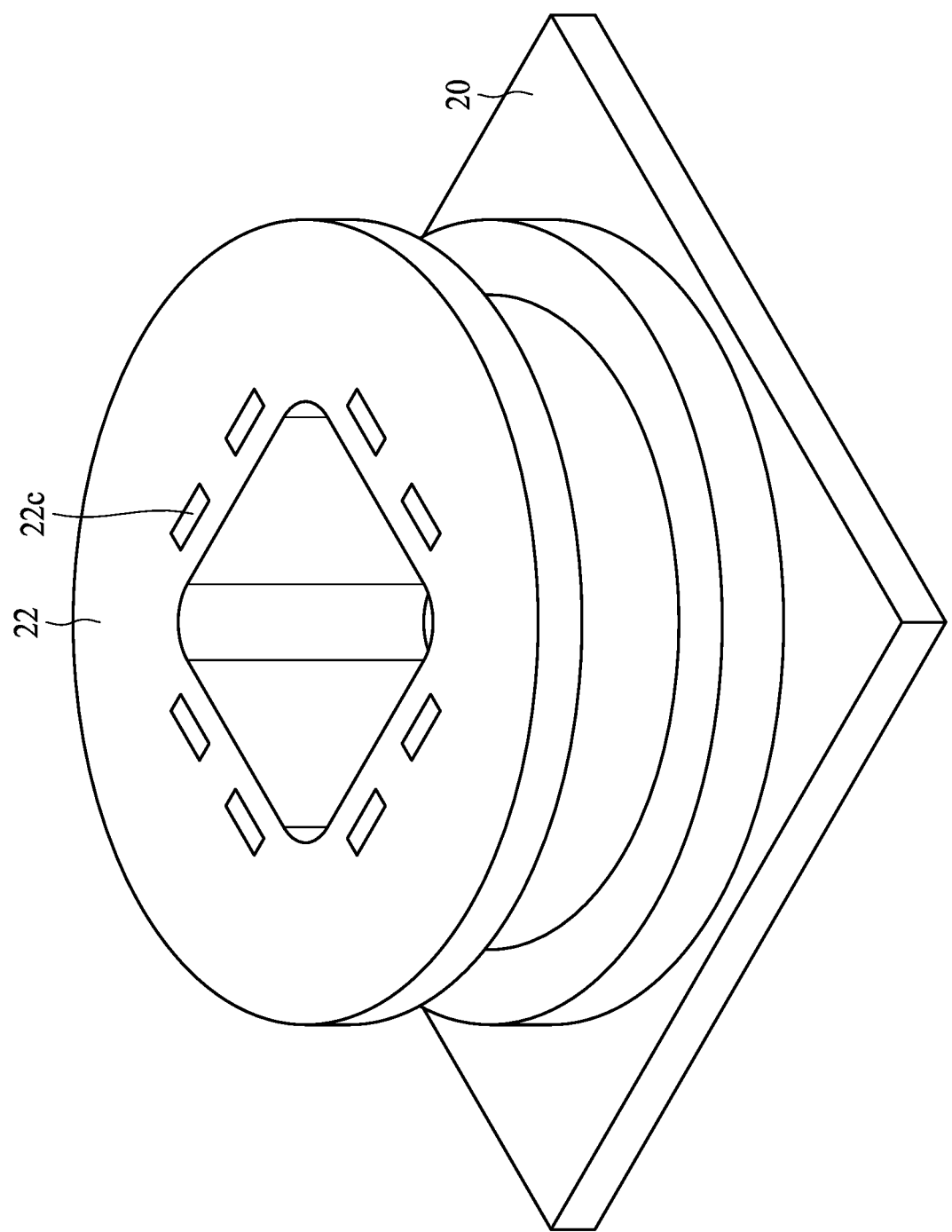
FIG. 4C shows a configuration of an interconnection structure and a carrier in accordance with some embodiments of the present disclosure.

FIG. 4C shows a configuration of an interconnection structure 22 and a carrier 20 in accordance with some embodiments of the present disclosure. In some embodiments, the shape of the interconnection structure 22 or the number or arrangement of the conductors can be changed depending on different specifications.

Figure 5A:
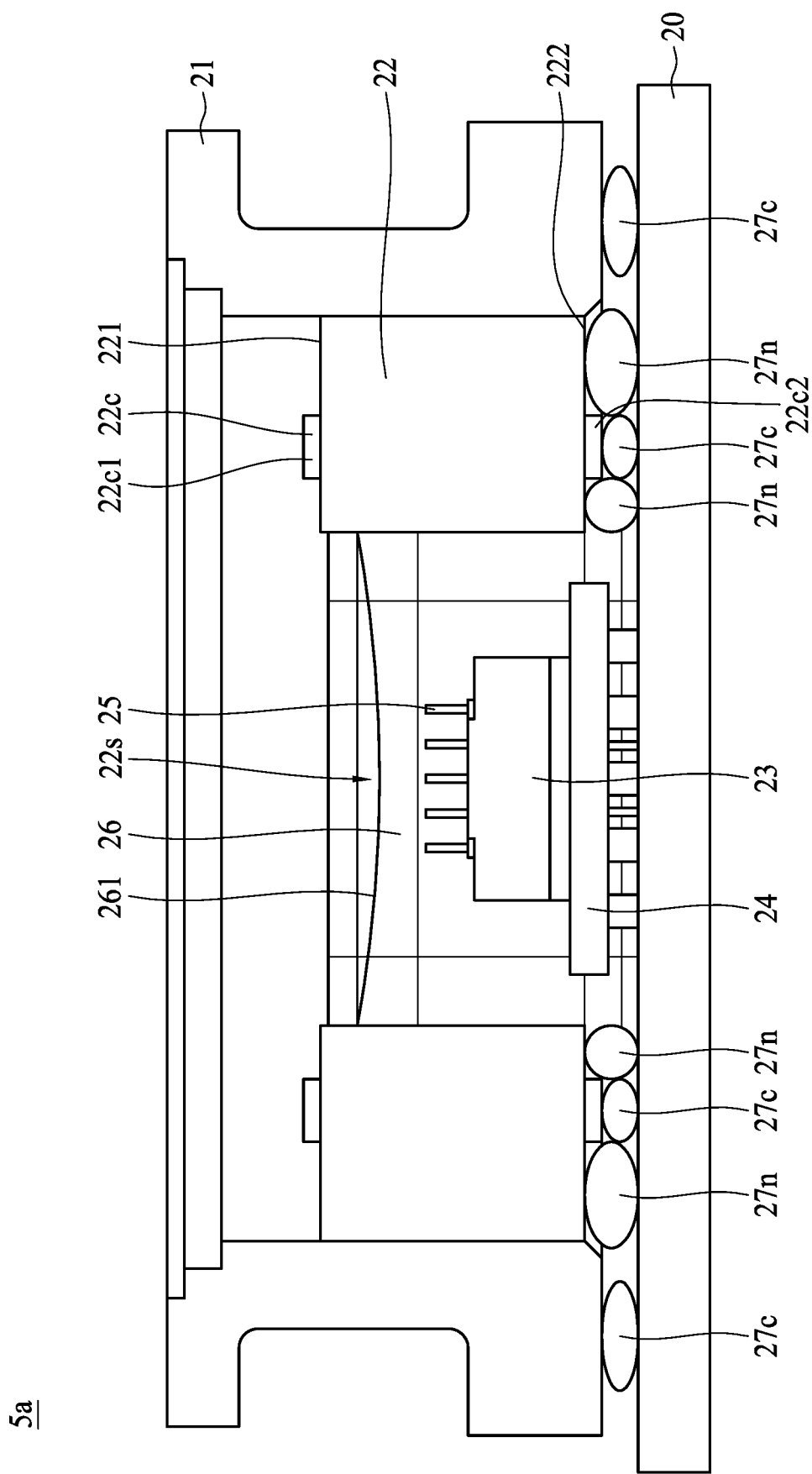
FIG. 5A shows a cross-sectional view of a sensor package in accordance with some embodiments of the present disclosure.

FIG. 5A shows a cross-sectional view of a sensor package in accordance with some embodiments of the present disclosure. The sensor package 5a is similar to the sensor package 2a in FIG. 2A or the sensor package 2b in FIG. 2B, and the differences therebetween described below.

A terminal (or an end) 22c1 of the conductor 22c protrudes over a surface 221 of the interconnection structure 22. The configuration of the terminal 22c1 may improve electrical connection between the conductor 22c and another electronic device. A terminal (or an end) 22c2 of the conductor 22c protrudes over a surface 222 of the interconnection structure 22. The configuration of the terminal 22c2 may improve electrical connection between the conductor 22c and the carrier 20.

An adhesive material 27c is between the housing 21 and the substrate 20. An adhesive material 27c is disposed to bond or connect the housing 21 to the substrate 20. An adhesive material 27c is between the conductor 22c of the interconnection structure 22 and the substrate 20. An adhesive material 27c is between the terminal 22c2 of the conductor 22c and the substrate 20. An adhesive material 27c is disposed to bond or connect the connector 22c to the substrate 20. An adhesive material 27c may have conductive material, for example, a conductive glue.

An adhesive material 27n is between the interconnection structure 22 and the substrate 20. An adhesive material 27n is disposed to bond or connect the interconnection structure 22 to the substrate 20. An adhesive material 27n may not have conductive material. An adhesive material 27n may have insulation material, for example, a non-conductive glue.

An insulation material 26 is disposed within the space 22s defined by the interconnection structure 22. The insulation material 26 is filled into the space 22s. The sensor 23 or the electronic component 24 may be at least partly sealed by or embedded in the insulation material 26. The insulation material 26 may be used for transducing or transferring pressure. A surface 261 of the insulation material 26 is not coplanar or lower than a surface 221 of the interconnection structure 22. In some other embodiments, a surface 261 of the insulation material 26 may be coplanar with a surface 221 of the interconnection structure 22.

Figure 5B:
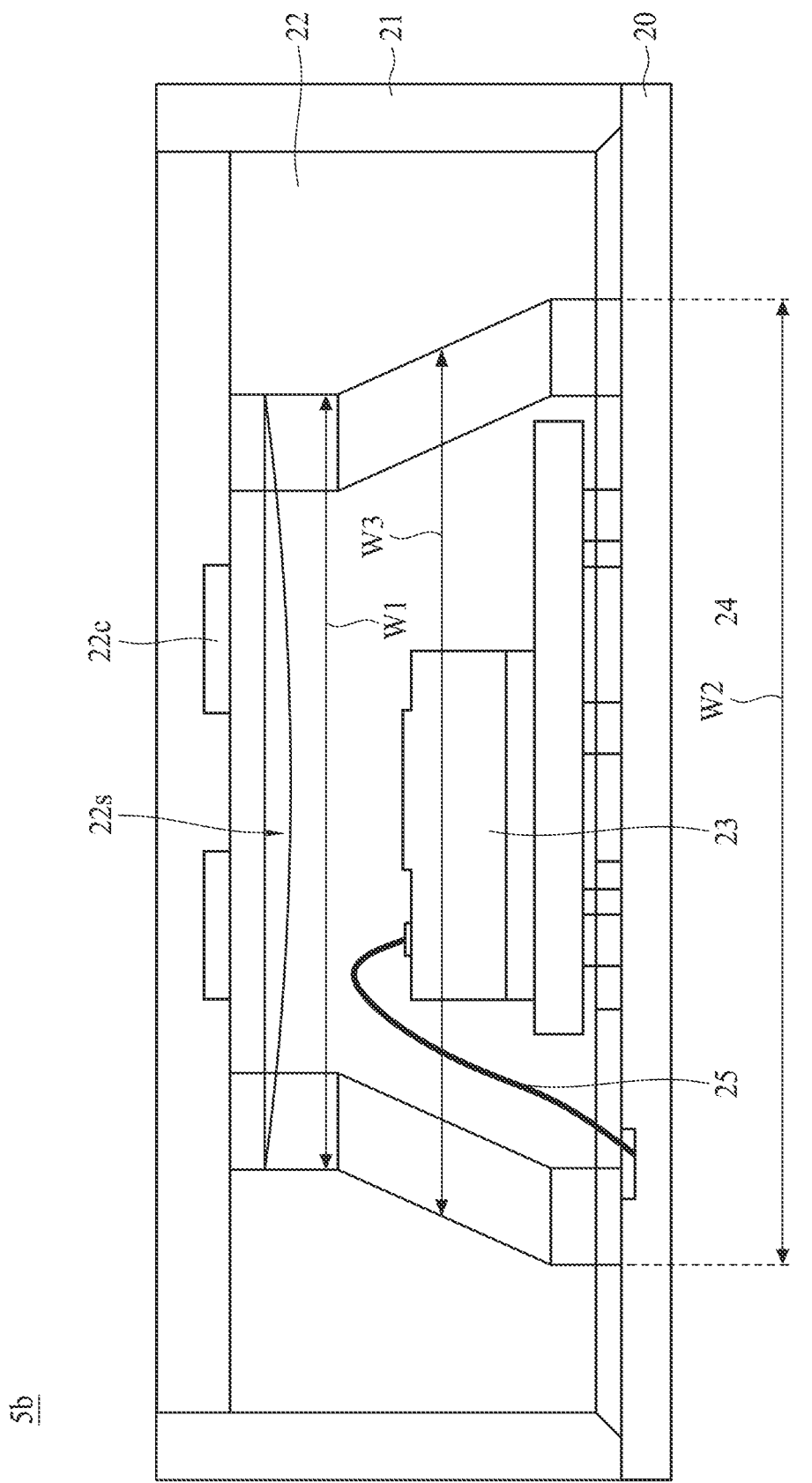
FIG. 5B shows a cross-sectional view of a sensor package in accordance with some embodiments of the present disclosure.

FIG. 5B shows a cross-sectional view of a sensor package 5b in accordance with some embodiments of the present disclosure. The sensor package 5b is similar to the sensor package 3c in FIG. 3C, except that the space 22s defined by the interconnection structure 22 has a width W1 and a width W2 greater than the width W1. The space 22s defined by the interconnection structure 22 has a width W3 less than the width W2.

Figure 5C:
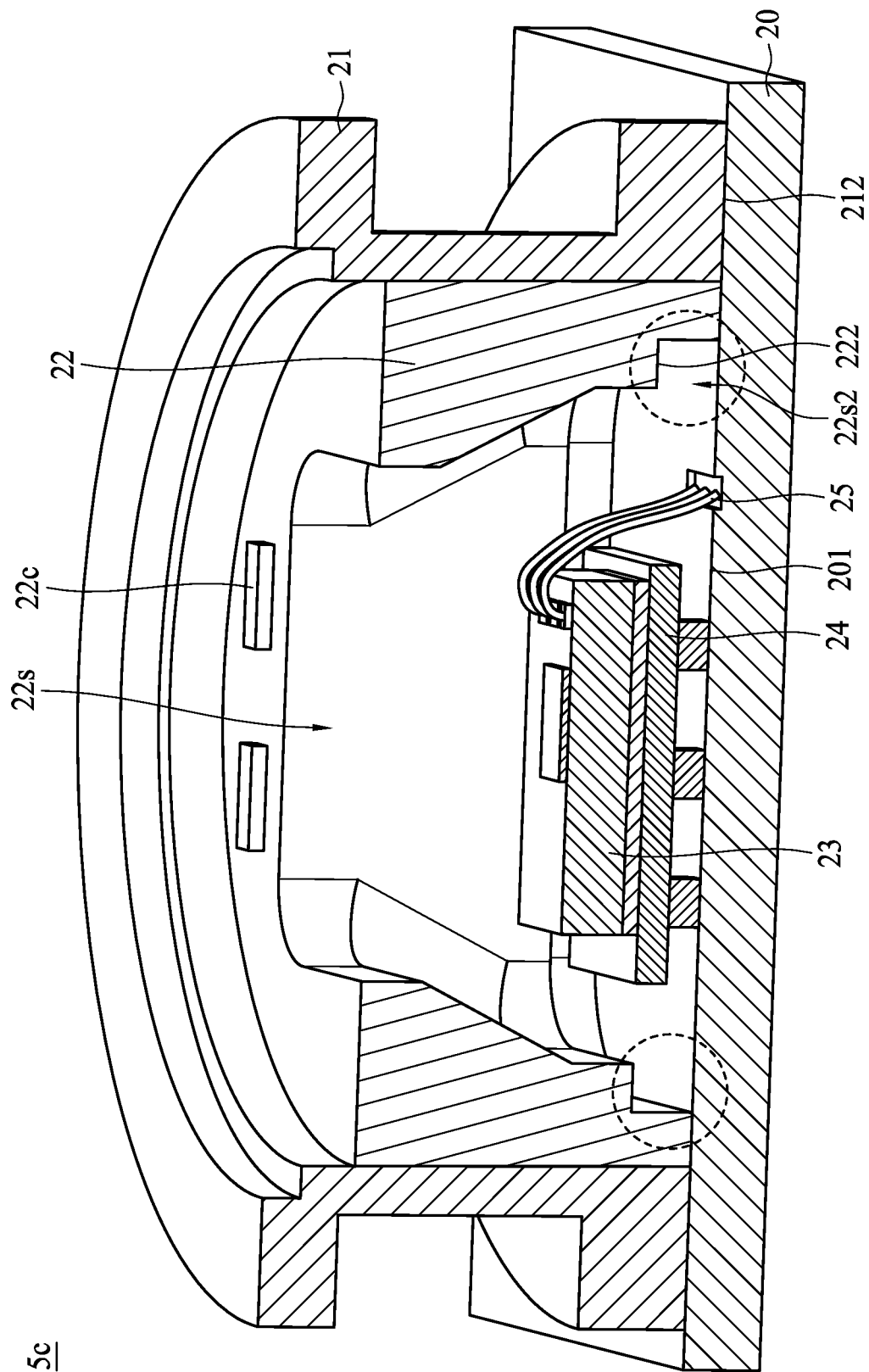
FIG. 5C shows a cross-sectional view of a sensor package in accordance with some embodiments of the present disclosure.

FIG. 5C shows a cross-sectional view of a sensor package 5c in accordance with some embodiments of the present disclosure. The sensor package 5c is similar to the sensor package 3c in FIG. 3C, and the differences therebetween are described below.

Figure 5D:
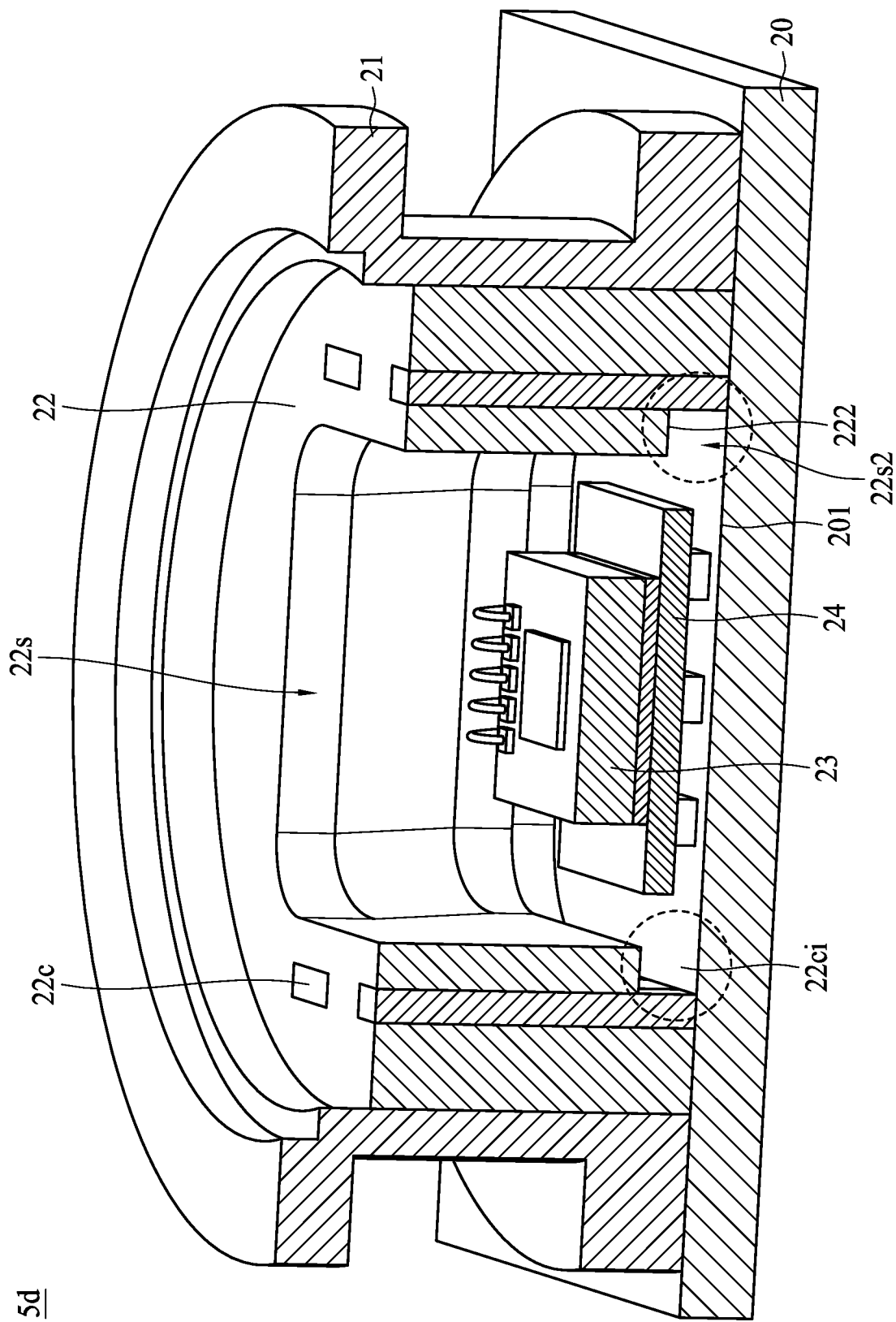
FIG. 5D shows a cross-sectional view of a sensor package in accordance with some embodiments of the present disclosure.
Figure 5E:
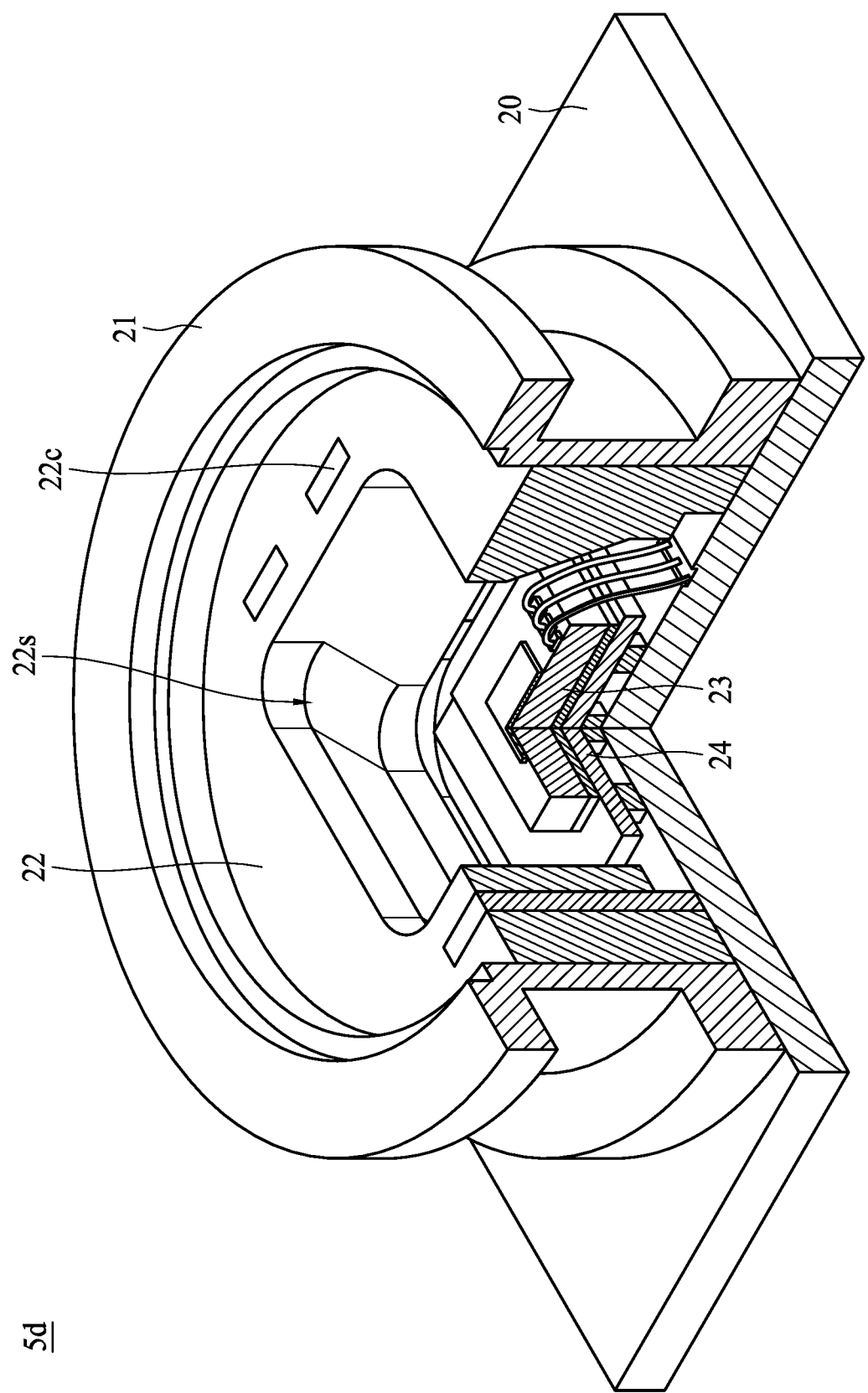
FIG. 5E shows a cross-sectional view of a sensor package in accordance with some embodiments of the present disclosure.

A surface 222 of the interconnection structure 22 is not coplanar with a surface 212 of the housing 21. A space 22s2 is defined by a surface 222 of the interconnection structure 22 and a surface 201 of the substrate 20. A portion of the wire 25 extends into the space 22s2. A portion of the wire 25 is accommodated in the space 22s2, which would further reduce the size of the sensor package 5c FIG. 5D shows a cross-sectional view of a sensor package 5d in accordance with some embodiments of the present disclosure. FIG. 5E shows a perspective view of the sensor package 5d in accordance with some embodiments of the present disclosure. A sidewall 22ci of the conductor 22c is exposed to the space 22s defined by the interconnection structure 22. A space 22s2 is defined by a surface 222 of the interconnection structure 22 and a surface 201 of the substrate 20.

Figure 5F:
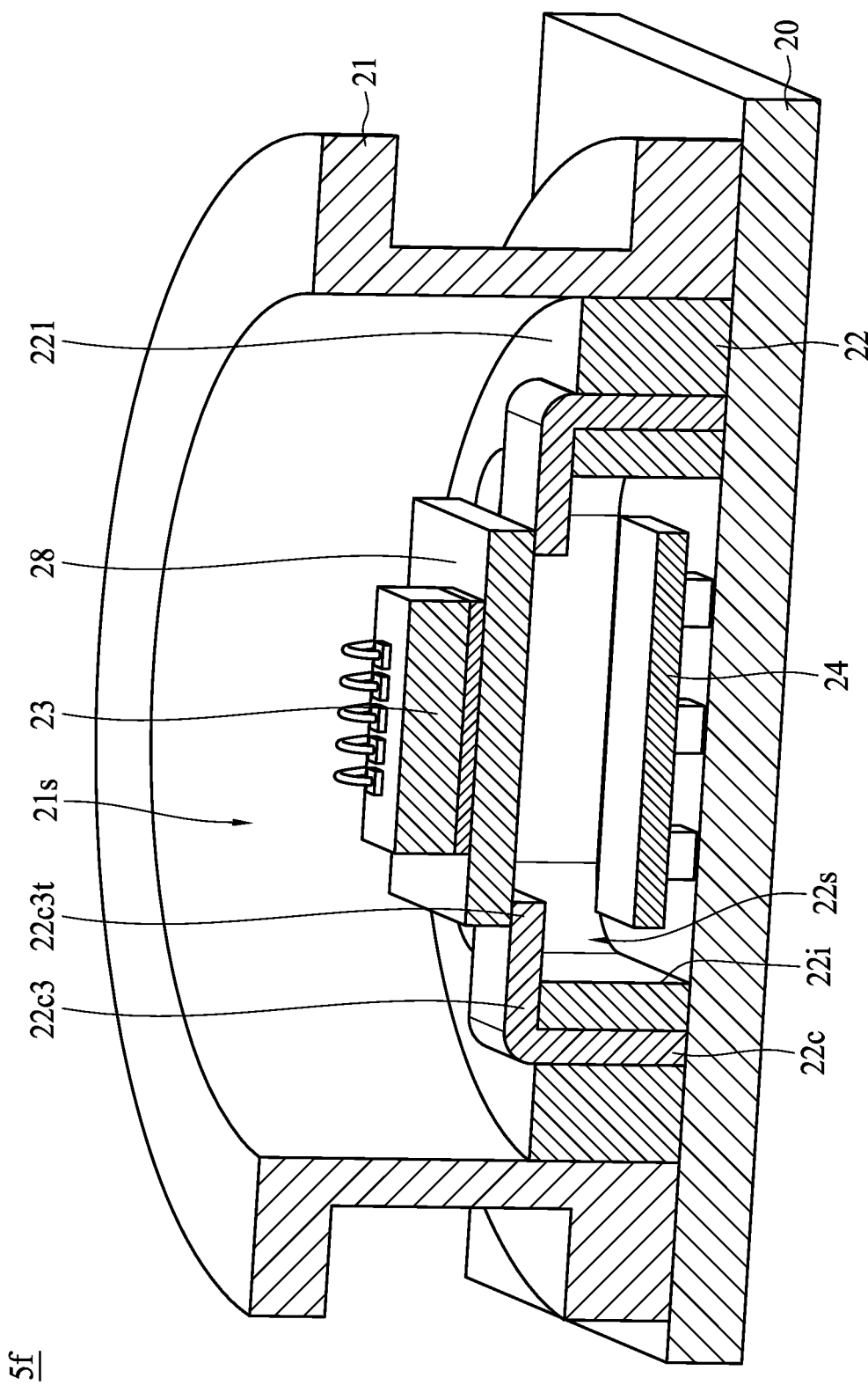
FIG. 5F shows a cross-sectional view of a sensor package in accordance with some embodiments of the present disclosure.

FIG. 5F shows a cross-sectional view of a sensor package 5f in accordance with some embodiments of the present disclosure.

Referring to FIG. 5F, the sensor 23 is over the interconnection structure 22. The sensor 23 is spaced apart from the electronic component 24. The sensor 23 is disposed on a carrier 28. The carrier 28 is disposed on a portion 22c3 of the conductor 22c of the interconnection structure 22. The carrier 28 may have similar properties as the carrier 20. The portion 22c3 protrudes over or extends beyond a surface 221 of the interconnection structure 22. The portion 22c3 extends in parallel to the surface 221 of the interconnection structure 22. A terminal or an end of the portion 22c3 extends over or beyond an inner sidewall 22i of the interconnection structure 22.

As used herein, the terms "substantially," "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two surfaces can be deemed to be coplanar or substantially coplanar if a displacement between the two surfaces is no greater than 5 μm, no greater than 2 μm, no greater than 1 μm, or no greater than 0.5 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A sensor package, comprising:
   a carrier;
   a sensor disposed on the carrier;
   an interconnection structure disposed on the carrier and surrounding the sensor, the interconnection structure having a first surface facing away from the carrier;
   a conductor protruding above the first surface of the interconnection structure; and a housing disposed on the carrier and surrounding the interconnection structure, wherein the interconnection structure defines a cavity to accommodate the sensor.

2. The sensor package of claim 1, further comprising an insulation material disposed within the cavity and encapsulating the sensor.

3. The sensor package of claim 1, wherein
the cavity has a first portion adjacent to the first surface of the interconnection structure and a second portion connecting to the first portion and adjacent to the carrier; and
a width of the first portion of the cavity is less than a width of the second portion of the cavity.

4. The sensor package of claim 3, wherein
the cavity further includes a third portion connecting to the second portion and between the second portion and the carrier; and
a width of the third portion of the cavity is greater than a width of the second portion of the cavity.

5. The sensor package of claim 4, wherein a portion of the conductor is exposed to the third portion of the cavity.

6. The sensor package of claim 1, wherein the conductor is electrically connected to the sensor.

7. The sensor package of claim 1, wherein the conductor penetrates the interconnection structure and is electrically connected to the carrier.

8. The sensor package of claim 1, wherein the housing has a first surface facing away from the carrier, and the first surface of the interconnection structure is substantially coplanar with the first surface of the housing.

9. The sensor package of claim 1, wherein the housing has a first surface facing away from the carrier, and the first surface of the interconnection structure is recessed from the first surface of the housing.

10. The sensor package of claim 1, wherein the interconnection structure is in contact with the housing.

11. The sensor package of claim 1, wherein the interconnection structure is physically spaced apart from the housing.

12. The sensor package of claim 1, wherein an inner sidewall of the interconnection structure is slanted with respect to the first surface of the interconnection structure.

13. The sensor package of claim 1, wherein the interconnection structure comprises an insulation material surrounding the conductor.

14. The sensor package of claim 1, further comprising a processor disposed on the carrier and electrically connected to the conductor, wherein the sensor is disposed on a backside surface of the processor.

15. A sensor package, comprising:
a first carrier;
an interconnection structure disposed on the first carrier, the interconnection structure having a first surface facing away from the first carrier;
a conductor protruding above the first surface of the interconnection structure;
a sensor disposed on the interconnection structure and electrically connected to the conductor; and
a housing disposed on the first carrier and surrounding the interconnection structure and the sensor, wherein the interconnection structure defines a cavity to expose the first carrier, and the sensor is disposed over the cavity.

16. The sensor package of claim 15, wherein the conductor extends in parallel to the first surface of the interconnection structure.

17. The sensor package of claim 15, wherein the conductor extends over the cavity.

18. The sensor package of claim 17, further comprising a second carrier disposed on the conductor and over the cavity, wherein the sensor is disposed on the second carrier.

19. The sensor package of claim 15 further comprising a processor disposed on the first carrier and within the cavity, wherein the processor is electrically connected to the conductor.

20. A sensor package, comprising:
a carrier;
a sensor disposed on the carrier;
an interconnection structure disposed on the carrier and surrounding the sensor, the interconnection structure having a first surface facing away from the carrier;
a conductor protruding above the first surface of the interconnection structure; and
a housing disposed on the carrier and surrounding the interconnection structure, wherein the conductor penetrates the interconnection structure and is electrically connected to the carrier.

21. A sensor package, comprising:
a carrier;
a sensor disposed on the carrier;
an interconnection structure disposed on the carrier and surrounding the sensor, the interconnection structure having a first surface facing away from the carrier;
a conductor protruding above the first surface of the interconnection structure; and
a housing disposed on the carrier and surrounding the interconnection structure,
wherein the housing has a first surface facing away from the carrier, and the first surface of the interconnection structure is substantially coplanar with the first surface of the housing.

22. A sensor package, comprising:
a carrier;
a sensor disposed on the carrier;
an interconnection structure disposed on the carrier and surrounding the sensor, the interconnection structure having a first surface facing away from the carrier;
a conductor protruding above the first surface of the interconnection structure; and
a housing disposed on the carrier and surrounding the interconnection structure, wherein the interconnection structure is in contact with the housing.

23. A sensor package, comprising:
a carrier,
a sensor disposed on the carrier;
an interconnection structure disposed on the carrier and surrounding the sensor, the interconnection structure having a first surface facing away from the carrier;
a conductor protruding above the first surface of the interconnection structure; and
a housing disposed on the carrier and surrounding the interconnection structure,
wherein an inner sidewall of the interconnection structure is slanted with respect to the first surface of the interconnection structure;
and wherein the interconnection structure defines a cavity to accommodate the sensor.

24. A sensor package, comprising:
a carrier,
a sensor disposed on the carrier;
an interconnection structure disposed on the carrier and surrounding the sensor, the interconnection structure having a first surface facing away from the carrier;
a conductor protruding above the first surface of the interconnection structure; and a housing disposed on the carrier and surrounding the interconnection structure,
wherein the interconnection structure comprises an insulation material surrounding the conductor;
and wherein the interconnection structure defines a cavity to accommodate the sensor.

* * * * *